United States Patent [19]

Liou

[11] Patent Number: 4,835,779
[45] Date of Patent: May 30, 1989

[54] METHOD AND APPARATUS FOR THE OPERATION OF A DISTRIBUTED FEEDBACK LASER

[75] Inventor: Kang-Yih Liou, Holmdel, N.J.

[73] Assignee: American Telephone and Telegraph Company, AT&T Bell Laboratories, Murray Hill, N.J.

[21] Appl. No.: 46,595

[22] Filed: May 4, 1987

[51] Int. Cl.⁴ ........................... H01S 3/10; H01S 3/08
[52] U.S. Cl. ........................................ 372/26; 372/28; 372/29; 372/46; 372/96; 372/87; 372/102
[58] Field of Search ....................... 372/96, 18, 23, 38, 372/46, 92, 19, 8, 26, 28, 102

[56] References Cited

U.S. PATENT DOCUMENTS 4,243,951  1/1981  Wolkstein et al. .................... 372/26

FOREIGN PATENT DOCUMENTS 0117284  7/1984  Japan .................................... 372/38

OTHER PUBLICATIONS

*IEEE Journal of Quantum Electronics*, QE-21 (1985), pp. 1880–1886, "Verification of the Light Phase Effect at the Facet on DFB Laser Properties", T. Matsuoka et al.

*Electronics Letters*, vol. 22, No. 22, Oct. 23, 1986, pp. 1153–1154, "Broad Wavelength Tuning Under Single—Mode Oscillation with a Multi—Electrode Distributed Feedback Laser", Y. Yoshikuni et al.

*10th IEEE International Semiconductor Laser Conference*, Kanazawa, Japan, Oct. 1986, pp. 64–65, "Improvement of Single Longitudinal Mode Stability by Gain Profile Control in DFB LD", by M. Yamaguchi et al.

*Primary Examiner*—William L. Sikes
*Assistant Examiner*—Georgia Y. Epps
*Attorney, Agent, or Firm*—Wilford L. Wisner

[57] ABSTRACT

There are disclosed a method and apparatus for producing laser pulses at two wavelengths alternately by switching the oscillations of a distributed feedback semiconductor laser of the continuous grating type back and forth across the stop band. The necessary shaping of the gain or index of refraction characteristic along the path of the oscillations is accomplished in part by two top electrodes, one of which is longer than the other along that path, and by varying the current supplied to at least one of those electrodes in the appropriate sense. Applications for optical communication and for optical logic are disclosed, the preferred embodiment being a transmitter for an optical communication system with minimal chirp of the optical pulses, in which pulses at one of the wavelengths are modulated at a bit rate exceeding 1 Gigabit by direct-modulation control of the switching of the laser, and the pulses at the other of the two wavelengths are discarded.

13 Claims, 4 Drawing Sheets

METHOD AND APPARATUS FOR THE OPERATION OF A DISTRIBUTED FEEDBACK LASER

TECHNICAL FIELD

This invention relates to distributed feedback semiconductor lasers and to techniques for control and selection of oscillation wavelengths and to uses of the resulting apparatus.

BACKGROUND OF THE INVENTION

Semiconductor lasers have always required special techniques for controlling their oscillation wavelengths, and in many cases, techniques for achieving a single-wavelength of oscillation. Nevertheless, such results have been difficult to obtain reliably, particularly when the laser is pulsed. One of the techniques which has been employed is to use a periodic variation of index of refraction, to produce the effect of a continuous diffraction grating, or nearly continuous grating, substantially coplanar with the lasing junction. The result was frequently oscillations which occurred at either or both of two wavelengths on either side of a "stop band", which was centered around the desired center wavelength, commonly called the Bragg wavelength.

Oscillation at the Bragg wavelength has been achieved by introducing a small, typically "quarter-wave length", discontinuity in the center of the otherwise continuous grating. It has been found that making commercial semiconductor lasers this way results in a very low yield, i.e., only a few are selected for use and the remainder are discarded.

Another technique achieves oscillation stably at one of the wavelengths at the edge of the stop band by introducing another sort of axial nonuniformity in the distributed feeback laser, such as shaping the refractive index or gain profile along the path of the oscillations by making one of the end faces of the semiconductor significantly less reflective than the other. It has been found that even this technique may suffer from the random locations of the end faces of the laser with respect to the phase of the period of the grating. For a description of the general problem associated with random location of the end faces, see T. Matsuoka et al, "Verification of the Light Phase Effect at the Facet on DFB Laser Properties", IEEE Journal of Quantum Electronics, QE-21, pp. 1880–1886 (1985).

Nevertheless, some significant stabilization and wavelength tuning results are disclosed in a pair of recent articles "Broad Wavelength Tuning Under Single-Mode Oscillation With A Multi-Electrode Distributed Feedback Laser" by Y. Yoshikuni et al, in Electronics Letters, Vol. 22, No. 22, Oct. 23, 1986, pp. 1153–1154 and "Improvement of Single Longitudinal Mode Stability by Gain Profile Control in DFB LD" by M. Yamaguchi et al, in 10th IEEE International Semiconductor Laser Conference, Kanazawa, Japan, October 1986, pp. 64–65. It thus appears that the dual electrode structure of the devices disclosed in those references provides an alternate way of shaping the refractive index or gain profile of distributed feedback lasers.

Nevertheless, it is apparent from a close reading of these articles that both lasers were carefully selected initially to oscillate at a single-wavelength before the split electrode structure was provided. Thus, the same problems of low yields will probably result from these techniques as were experienced heretofore. Moreover, a full amplitude modulation of those lasers to produce the pulses typically desired in an optical fiber-based communication system will tend to be slow because of the large changes in carrier concentrations required, and in the general case will be accompanied by significant undesired "chirp" of the oscillation wavelength.

Accordingly, it is an object of this invention to achieve rapid pulsing of distributed feedback lasers at discrete single-wavelengths and to minimize the frequency change or "chirp" of such wavelengths. Another object of this invention is to employ laser devices of the distributed feedback type which are initially likely to oscillate at either, or both, wavelengths at the sides of the stop band and, therefore, would previously have been discarded.

A further object of this invention is to provide a transmitter for an optical communication system in which a distributed feedback laser is modulated at a higher information bit rate and with less chirp than heretofore possible.

SUMMARY OF THE INVENTION

The foregoing and other objects of this invention are achieved in apparatus including a distributed feedback semiconductor laser by biasing the laser so that it is relatively near the conditions for switching of the oscillations across the stop band and driving oscillations controllably across the stop band by an asymmetry introduced by a change in gain or index of refraction along the path of the oscillations in the laser. It has been discovered that this result can be accomplished more rapidly and with smaller changes than would be required for pulsed single-wavelength operation of the laser.

In a preferred embodiment of my invention comprising an optical transmitter, the distributed feedback laser is driven across the stop band in response to direct modulation by signal pulses representative of the information to be transmitted. The pulse stream having a wavelength found at one side of the stop band is transmitted; and the pulse stream having a wavelength found at the other side of the stop band is discarded, since it carries only redundant information.

It is an advantage of my invention that this kind of control of a distributed feedback semiconductor laser can readily compensate for otherwise uncontrollable asymmetries in the structure of the laser as manufactured, such as random locations of the cleaved end faces of the semiconductor with respect to the phase of the period of the grating.

It is a further advantage of my invention that precisely those lasers which are discarded because of the uncontrolled two-wavelength problem, according to the teaching of the prior art, are the preferred candidates for use according to my invention.

Moreover, the rapid switching achieved may be advantageous in other wavelength-multiplexed optical communication systems employing separate modulation instead of direct modulation of the laser, in which the second wavelength can be used to increase capacity, and is also advantageous in optical logic systems, inasmuch as various combinations of amounts and senses of changes in the laser control currents can yield a logic function, the result of which is indicated by the discrete change in the output wavelength of the laser.

DETAILED DESCRIPTION

Figure 1:
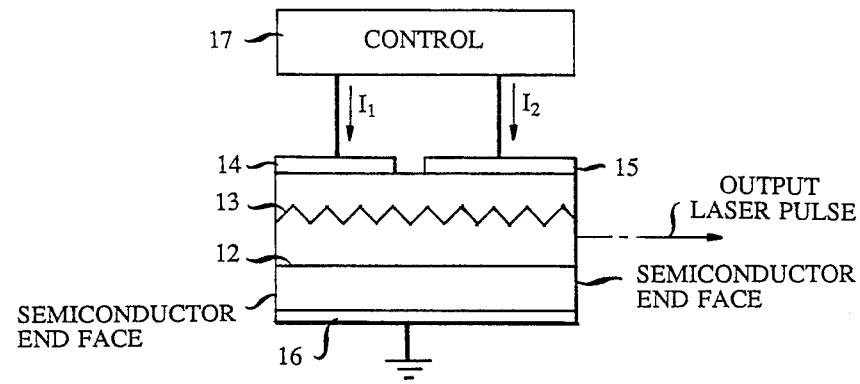
FIG. 1 shows the basic embodiment of the invention.

In FIG. 1, the laser structure 11 is a semi-insulating planar buried heterostructure (SIPBH) type having a p-n junction 12 and a first order grating 13. Two oscillation wavelengths, $\lambda_{-1}$ and $\lambda_{+1}$, separated by a 12 Å stop band, can operate above oscillation threshold. The two semiconductor end faces are cleaved and uncoated, but they could also be coated. The emission wavelength is near 1.3 μm. For excitation of the laser, the bottom or ground electrode 16 is provided in conventional fashion, but the top electrode is split into two portions 14 and 15, of equal width along the top surface of the semiconductor orthogonal to the path of the laser oscillations but respectively illustratively 160 μm and 95 μm long in the direction of the path. The reason for such an asymmetry in electrodes 14 and 15 is to keep oscillations at the so-called Bragg wavelength, in the center of the stop band, suppressed as currents $I_1$ and $I_2$ are changed to produce the switching of the oscillations across the stop band. The separate electrodes were produced by etching away the contact metalization on top of the chip to produce a small gap with about 150 ohms electrical isolation. The gap between electrodes 14 and 15 is typically 25 μm. The electrodes could also be provided by conventional photolithographic techniques.

Figure 2:
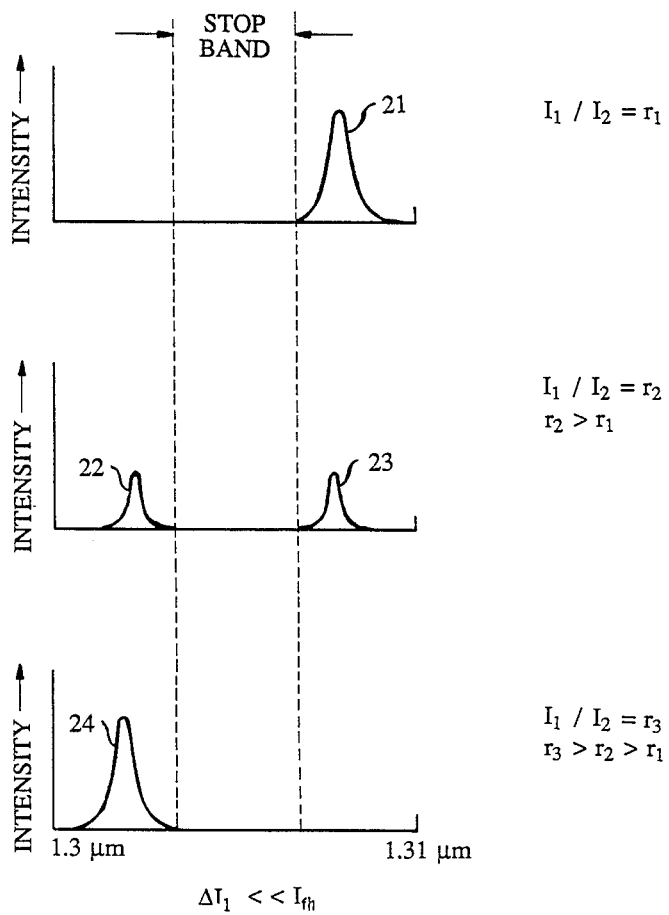
FIG. 2 shows light-intensity versus wavelength curves useful in explaining the operation of the invention.

Referring to FIG. 2, we see that the stop band, which results from the continuous periodic grating 13, is illustratively between the two vertical dashed lines which are common to the spectra of parts (a), (b) and (c).

Initially, Control means 17 is a high output-impedance current source that initially provides a ratio of $I_1/I_2$ that provides laser oscillation at the upper wavelength $\lambda_{+1}$, as indicated by spectrum 21 in part (a). The respective currents might be $I_1=26$ mA and $I_2=21.5$ mA, whereby the current densities are comparable. As shown in part (b), increasing current $I_1$ to 26.8 mA causes both wavelengths to either side of the stop band to oscillate, as shown by spectra 22 and 23.

A further increase of $I_1$ to 28 mA causes oscillation to switch fully to the lower wavelength, as shown by spectrum 24 in part (c).

Note that this result is equivalent to pulsed generation of each of the two wavelengths without reducing the total current of the laser 11 to a value below the threshold of oscillation. In fact, continuing to hold $I_2$ constant, we would have to reduce $I_1$ to about 14 mA to reach that threshold. The threshold current for continuous-wave operation was 34 mA, total, at 23° C. In other words, we have achieved a sufficient result with only 15% as much change as required for pulsed operation if electrodes 14 and 15 were combined. The carrier storage and associated time delays in laser 11 are similarly lower, as is the wavelength change, or "chirp" of the laser oscillations.

The above-described technique for pulsing the laser oscillations can be utilized advantageously for optical communication. The stop band widths are typically in the 10 to 25 Å range, so that the wavelengths $\lambda_{-1}$ and $\lambda_{+1}$ can be easily resolved by a wavelength filter. When the laser is biased near the oscillation wavelength switching boundary conditions and a suitable (e.g., ±2 mA) square wave signal is added to $I_1$, and then the two wavelengths are separated by a diffraction grating and then detected with a PIN photodiode, there are obtained negligible cross talk and a 1 ns switching time, limited by the speed of the signal. Frequency-shift keying and logic gating, similar to that previously demonstrated using a cleaved-coupled-cavity laser, but having simplified two-wavelength operation and having non-critical current control, can be achieved by the invention.

I note, especially, that this device does not require the critical current control necessary for the operation of coupled-cavity lasers. And I believe that it can provide a useful alternative to quarter-wavelength shifted gratings in distributed feedback lasers for single-wavelength oscillations and that it may be of interest as a source in lightwave systems where frequency-shift-keyed (FSK) modulation is required, or where switching and routing functions may be necessary. The routing function can be thought of as an optical logic function, and will be discussed hereinafter.

In the operation of the embodiment of FIG. 1, the asymmetry in the distributed feedback semiconductor laser structure introduced by two-electrode control was observed to stabilize one of the two oscillation wavelengths which otherwise would be less stable or would co-exist with the other. Although differing reflections can also introduce unpredictable asymmetry from device to device, as does also the position of the endface, which is cleaved randomly without detailed control of its location with respect to the phase of the period of the grating 13, in the operation of the present invention, both single-wavelength operation and high-speed wavelength switching were readily achieved by appropriate control of currents $I_1$ and $I_2$. This controllability is achieved without a discontinuity in grating 13 and without anti-reflection coatings of the end faces of the laser 11.

It is noteworthy that no hysteresis was observed in switching the oscillations back across the stop band when $I_1$ was varied in the opposite direction, after the increase described above.

In a particular example, the $\lambda_{+1}$ and $\lambda_{-1}$ oscillation power ratio increases from 210:1 at $I_1=26$ mA to 2000:1 at $I_1=24.8$ mA while $I_2$ was fixed at 21.5 mA. This indicates that a change in $I_1$ of about 4 mA was required to switch completely from one oscillation wavelength to the other.

Figure 4:
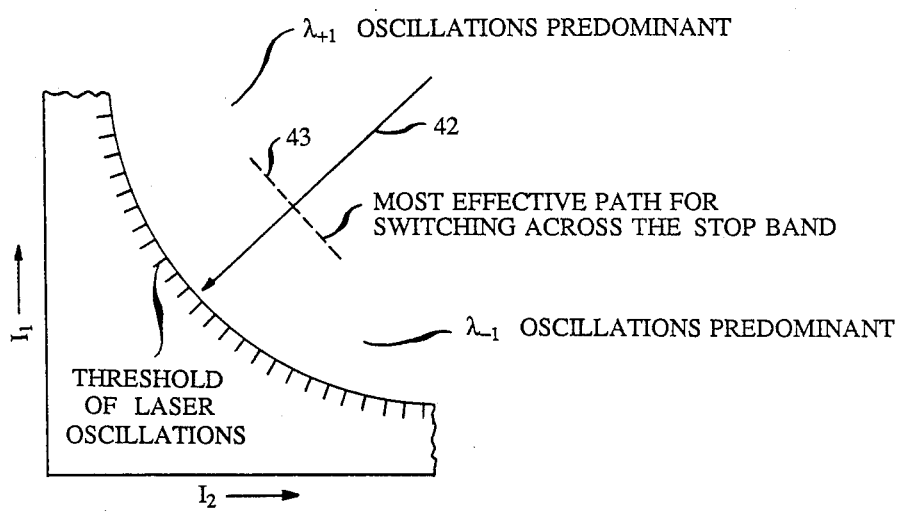
FIG. 4 shows an idealized control diagram for the embodiment of FIG. 1.

The mode switching boundary in the $I_1$-$I_2$ plane is shown as a solid line in FIG. 4. The most effective path for complete wavelength switching is indicated by dotted line 43, although for ease of control, I have chosen to vary only the current $I_1$. The conditions for oscillation of the Fabry-Perot resonant wavelengths for this device are not indicated, as they reach threshold only when $I_2$ is much larger than $I_1$. The spacing between the Fabry-Perot wavelengths is 8 Å and they are about 80 Å away from the distributed feedback laser oscillation.

Absolute values of $I_1$ and $I_2$ are not shown in FIG. 4, as they will be dependent upon the particular device.

I note that there are large single-wavelength oscillation regimes in the $I_1$–$I_2$ plane, where either $\lambda_{-1}$ or $\lambda_{+1}$ oscillates with as much as 33 dB suppression of the other wavelengths. As a result, electrical control for single-wavelength oscillation is relatively simple and may be a useful alternative to the $\lambda/4$ phase-shifted-grating structure for single-mode distributed feedback lasers. It is noteworthy that this result is obtainable even when the device would have a strong tendency, in the absence of control, to oscillate at both wavelengths.

Switching from one wavelength to the other "across the stop band" requires a redistribution of carrier density in the two sections. Although the carrier density is saturated at threshold, the threshold current changes with the $I_1/I_2$ ratio, as shown in FIG. 4. The carrier densities and gain coefficients in the two sections can, therefore, still change with current, even when both sections are operated above threshold. While this effect may be a primary effect facilitating the operation of apparatus according to my invention, I do not wish to minimize the importance of the refractive index changes along the oscillation path produced by the changes in carrier densities.

Figure 3:
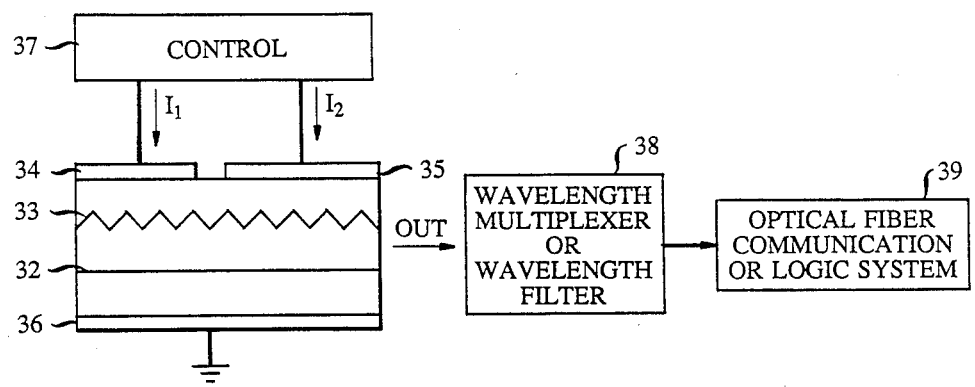
FIG. 3 shows an application of the invention to an optical fiber communication system or an optical fiber logic system.

The two-wavelength oscillation characteristic of the laser devices selected for use in my invention can be utilized advantageously in optical apparatus in which both wavelengths are desired outputs, as illustrated in FIG. 3. The laser is nearly identical to laser the laser of FIG. 1, even though the direction of output is reversed with respect to electrode placement. To separate the $\lambda_{-1}$ and $\lambda_{+1}$ wavelengths time-wise or spatially, as desired to process them, and/or to recombine them to one pulse train, a diffraction grating could be used as a wavelength filter which is a typical component of wavelength multiplexer or wavelength filter 38 in FIG. 3. The equipment 38 actually selected for a particular application depends on the number of different oscillation wavelengths needed and the modulation technique employed.

The output of equipment 38 is fed into the optical fiber system 39 which may be either a communication system or an optical logic system.

Figure 5:
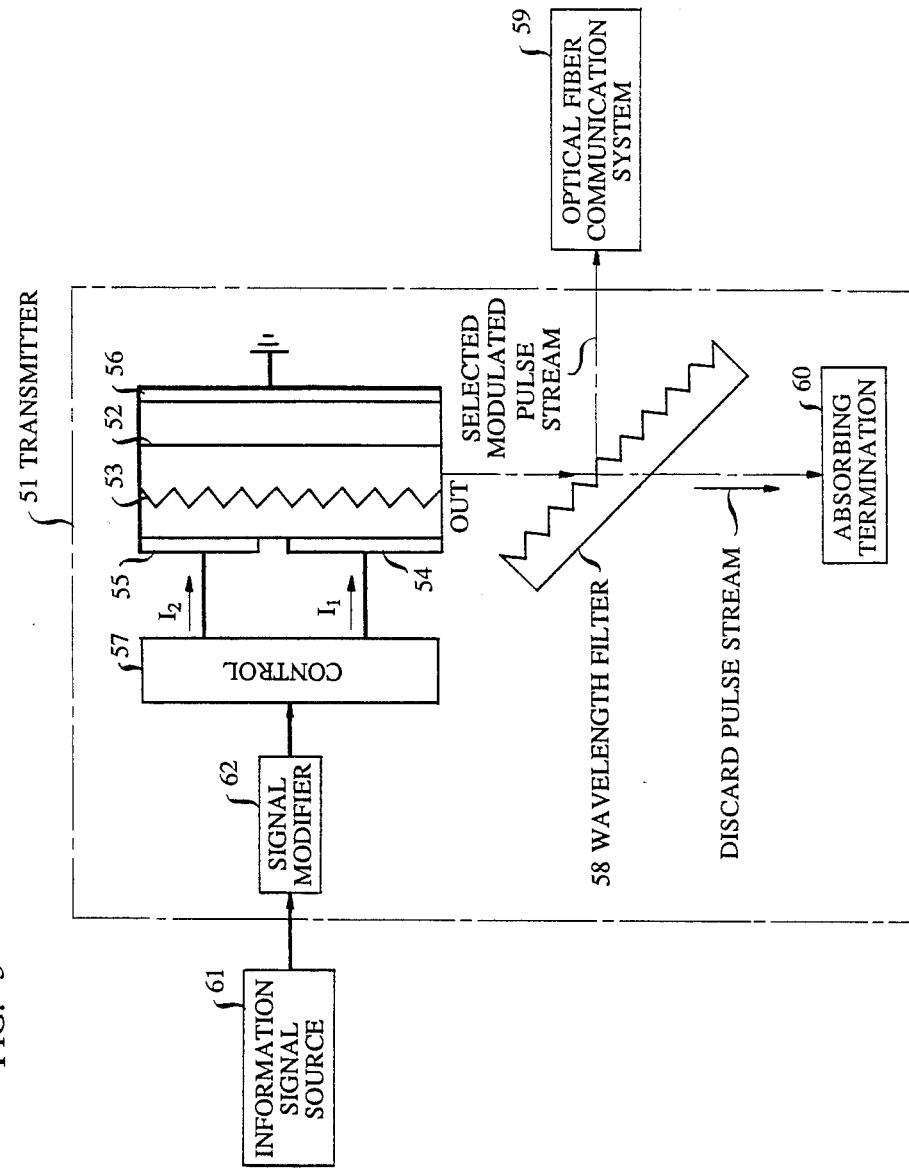
FIG. 5 shows a preferred optical communication system embodying the invention.

In the preferred embodiment of FIG. 5, it is desired to employ direct modulation of the distributed feedback laser in transmitter 51, so it is necessary to discard one of the two wavelengths, which can be directed to an absorbing termination, such as termination 60 in FIG. 5. The wavelength filter 58 can be a diffraction grating.

The information signal source 61 provides a baseband information signal, which could be analog, as from speech, or could be digital, as from the memory of a computer, to the signal modulator 62, which generates a pulse stream responsive to the information signal and of the right type and bit rate. The information-bearing pulse stream drives the control circuit 57 to change one or both of currents $I_1$ and $I_2$, as described hereinbefore, to drive the laser oscillations cross the stop band. The modulated pulse stream, illustratively at wavelength $\lambda_{-1}$, is directed into optical fiber communication system 59 by the wavelength filter 58 in transmitter 61.

In the operation of the embodiment of FIG. 5, modulation is obtained at bit rates higher than 1.0 Gigabits, indeed, at bit rates higher than could be achieved heretofore because of the reduced carrier storage in the distributed feedback lasers and the resulting reduced time delays in its modulation. Moreover, the resulting modulated pulse train will consist of pulses having less chirp than heretofore obtained in commercial optical communication systems, and will yield all resultant advantages relating to reduced degradation of the information during transmission and reception of the modulated pulse stream. For example, the transmitter 51 of FIG. 5 could be a portion of an optical fiber communication system at bit rates from about 1 Gigabit to about 15 Gigabits, but, most advantageously, from about 3 Gigabits to about 10 Gigabits.

Figure 6:
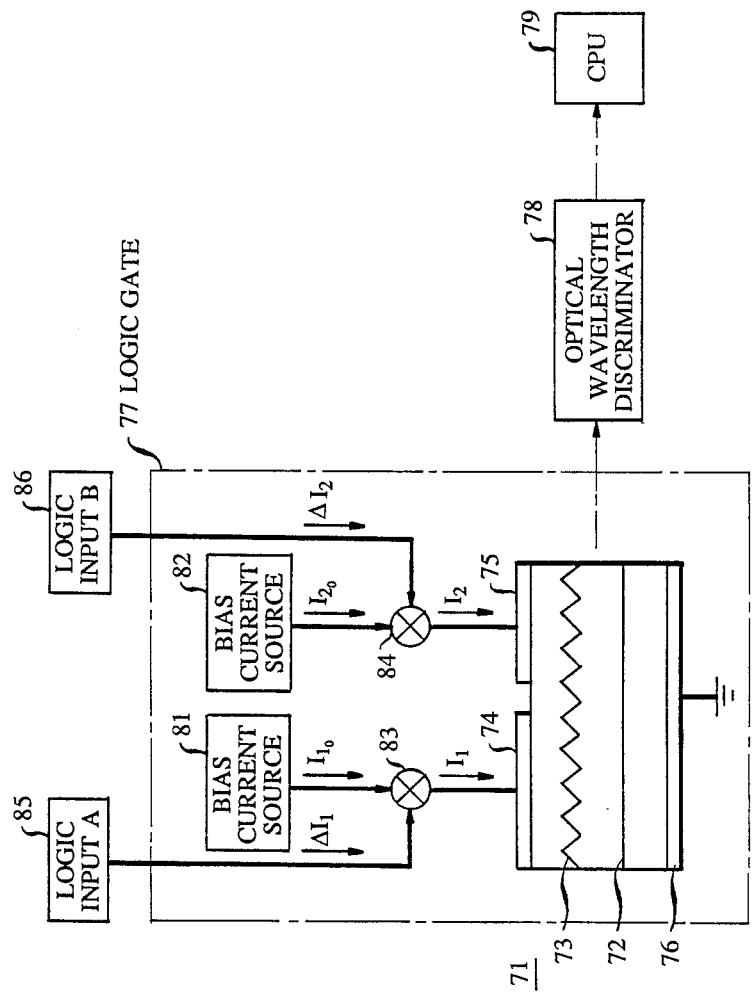
FIG. 6 shows an optical logic system embodying the invention.

An example of an optical logic system employing my invention is shown in FIG. 6. The laser 71 is similar to lasers 11, 31 and 51, including, for example, the relative difference in the lengths of electrodes 74 and 75. Control of the currents $I_1$ and $I_2$ is made responsive to the logic inputs 85 and 86, which will provide the changes, $\Delta I_1$ and $\Delta I_2$ needed for switching across the stop band, while the remainder of the currents are supplied from bias current sources 81 and 82. The output of the resulting logic gate 77 is directed to a suitable utilization circuit, such as optical wavelength discriminator 78 (which could be a photodetector which responds with distinctly different amplitudes to the two oscillations) and central processing unit 79.

One should note, as a general matter for all of the embodiments, the lasers shown in the figures were made to have two electrodes of unequal length because a short section near the center of the cavity without current injection (i.e., symmetrical electrodes 14 and 15) could result in an electrically introduced phase shift due to refractive index change, resulting in a $\lambda/4$-shifted distributed feedback laser structure. Oscillation could then be shifted toward the Bragg wavelength $\lambda_0$ at the center of the stop band, because of the $\lambda/4$-shift effect. Since the required threshold gain for the Bragg wavelength is lower than for the $\lambda_{-1}$ and $\lambda_{+1}$ modes, the laser might then oscillate in a single-mode at $\lambda_0$. If this is the case, the electrically-controlled $\lambda/4$-shift near the center of the grating may be a useful method for single-wavelength stabilization. For optical switching, however, a structure without the $\lambda/4$-shift is more desirable, since the lowest-order oscillation wavelengths at $\lambda_{-1}$ and $\lambda_{+1}$ then have similar threshold gains that can be switched easily.

In summary, the apparatus of the invention is capable of versatile electrical control of the two-wavelength oscillations in uniform-grating distributed feedback lasers by application of separate currents to divided electrodes on the devices. The required current control is relatively noncritical and facilitates high bit rate direct-modulation optical communication systems. This method of electrical control of such devices also provides a valuable alternative to the preparation of a $\lambda/4$-shifted grating for distributed feedback lasers, or adjustment of the location of the end faces with respect to the phase of the grating period by prior art techniques. Furthermore, while this electrical control can be used simply to stabilize operation of an initially two-wavelength device at a single-wavelength (and thereby perhaps increase production yields of distributed feedback lasers), it also may be used to switch rapidly between the two wavelengths on opposite sides of the stop band, with both communication and logic applications. Variations of those applications discussed above can be based on the same principles. The method and apparatus of my invention can be applied to any distributed feedback semiconductor laser, regardless of its wavelength of operation or its internal structural details.

What is claimed is:

1. Optical apparatus of the type including a distributed feedback semiconductor laser having a stop band in which laser oscillations are inhibited and beyond which laser oscillations can occur, said laser having controllable excitation biasing for two axially distinct portions of a path along which oscillations occur in said laser said apparatus being characterized by means periodically varying the excitation biasing of one of said portions with respect to the excitation biasing of the other of said portions for controllably switching the laser oscillations across the stop band.

2. Optical apparatus according to claim 1 in which the switching means is characterized by means for varying the conditions for laser oscillations asymmetrically along the path of propagation of the laser oscillations in the laser.

3. A transmitter for an optical communication system, of the type including a distributed feedback laser having a stop band in which laser oscillations are inhibited and beyond which laser oscillations can occur and including a source of an information signal for modulating the laser, said transmitter being characterized by means for applying the information signal to the laser to switch the laser oscillations across the stop band, whereby there result two streams of pulses having respective wavelengths charcteristic of the two sides of the stop band, and 4. Optical apparatus according to claim 1 in which the laser is characterized by comparable thresholds for the nearest oscillation wavelengths on either side of the stop band for some intermediate set of conditions of operation of the switching means.

5. Optical apparatus according to claim 4 characterized in that the laser includes an asymmetry that suppresses oscillation at the wavelength at the center of the stop band during switching by the switching means.

6. A transmitter according to claim 3 characterized in that the laser is capable of oscillating on either side of the stop band with little inherent preference therebetween, and the information signal applying means applies information-bearing pulses at a rate exceeding 1 Gigabit.

7. Optical apparatus according to claim 4 charcterized by at least two sources of optical logic input signals adapted for controlling the switching means and means for discriminating the wavelengths of the laser oscillations as optical logic output signals.

8. A method for operating a distributed feedback semiconductor laser having a stop band in which laser oscillations are inhibited and beyond which laser oscillations can occur, including providing nonuniform conditions for laser oscillations along the path of the laser oscillations, said method being characterized by changing said conditions along a portion of said path with respect to said conditions along the remainder of said path toward and through a region of instability to switch the laser oscillations across the stop band, and subsequently reversing the changing of said conditions.

9. A method according to claim 8 characterized by the additional step of selecting at least one single-wavelength portion of the oscillations for utilization.

10. A method according to claim 8 characterized by the initial step of selecting the laser to have nearly balanced tendencies for oscillations on the respective sides of the stop band, before providing the nonuniform conditions for laser oscillations.

11. A method according to claim 8 or 10 in which the step of changing the conditions to switch the laser oscillations across the stop band includes controlling the extent of the changes of the conditions to produce less chirp of the oscillations than obtained in pulsed operation of a comparable laser in which oscillations are not switched across the stop band.

12. A transmitter according to claim 6 characterized in that the information signal applying means applies information-bearing pulses at a rate between about 1 Gigabit and about 15 Gigabits.

13. A transmitter according to claim 6 characterized in that the information signal applying means applies information-bearing pulses at a rate between about 3 gigabits and about 10 Gigabits.

* * * * *

UNITED STATES PATENT AND TRADEMARK OFFICE
CERTIFICATE OF CORRECTION

PATENT NO. : 4,835,779

DATED : May 30, 1989

INVENTOR(S) : Kang-Yih Liou

It is certified that error appears in the above-identified patent and that said Letters Patent is hereby corrected as shown below:

In the Claims, claim 3, column 7, line 30, after "and" insert --means for selecting one of the two resultant streams of pulses for transmission.--; claim 7, column 8, line 3, "charcterized" should read --characterized--.

Signed and Sealed this

Twenty-second Day of May, 1990

Attest:

HARRY F. MANBECK, JR.

*Attesting Officer*   *Commissioner of Patents and Trademarks*